(12) United States Patent
Hu et al.

(10) Patent No.: US 9,385,056 B2
(45) Date of Patent: Jul. 5, 2016

(54) PACKAGING SUBSTRATE HAVING EMBEDDED INTERPOSER AND FABRICATION METHOD THEREOF

(75) Inventors: Dyi-Chung Hu, Taoyuan (TW); John Hon-Shing Lau, Hsinchu (TW)

(73) Assignees: Unimicron Technology Corporation, Taoyuan (TW); Industrial Technology Research Institute, Hsinchu (TW)

( * ) Notice: Subject to any disclaimer, the term of this patent is extended or adjusted under 35 U.S.C. 154(b) by 84 days.

(21) Appl. No.: 13/566,323

(22) Filed: Aug. 3, 2012

(65) Prior Publication Data
US 2013/0032390 A1 Feb. 7, 2013

(30) Foreign Application Priority Data
Aug. 5, 2011 (TW) .............................. 100128085 A

(51) Int. Cl.
*H01L 23/14* (2006.01)
*H01L 23/498* (2006.01)
*H01L 23/13* (2006.01)

(52) U.S. Cl.
CPC .............. *H01L 23/147* (2013.01); *H01L 23/13* (2013.01); *H01L 23/49822* (2013.01); *H01L 23/49827* (2013.01); *H01L 23/49833* (2013.01); *H01L 23/49816* (2013.01); *H01L 2224/16225* (2013.01); *H01L 2224/16227* (2013.01); *H01L 2924/15311* (2013.01); *Y10T 29/49165* (2015.01)

(58) Field of Classification Search
CPC combination set(s) only.
See application file for complete search history.

(56) References Cited

U.S. PATENT DOCUMENTS

| | | | |
|---|---|---|---|
| 6,324,067 B1 * | 11/2001 | Nishiyama | H05K 1/165 174/262 |
| 6,800,930 B2 * | 10/2004 | Jackson et al. | 257/700 |
| 2002/0075022 A1 * | 6/2002 | Pierce | G01R 1/0433 324/750.25 |
| 2005/0017271 A1 * | 1/2005 | Rokugawa et al. | 257/202 |
| 2006/0003495 A1 * | 1/2006 | Sunohara | H01L 21/4857 438/124 |
| 2008/0017407 A1 * | 1/2008 | Kawano | H01L 23/147 174/260 |
| 2009/0073667 A1 | 3/2009 | Chung et al. | |
| 2009/0145636 A1 * | 6/2009 | Miki | H01L 21/6835 174/255 |
| 2010/0081236 A1 | 4/2010 | Yang et al. | |

FOREIGN PATENT DOCUMENTS

| | | |
|---|---|---|
| CN | 101395978 | 3/2009 |
| JP | 2003-46022 | 2/2003 |
| JP | 2009-130104 | 6/2009 |
| JP | 2010-50475 | 3/2010 |
| JP | 2010-239126 | 10/2010 |
| TW | 201121376 | 6/2011 |

\* cited by examiner

*Primary Examiner* — William H Mayo, III
*Assistant Examiner* — Krystal Robinson
(74) *Attorney, Agent, or Firm* — Mintz Levin Cohn Ferris Glovsky and Popeo, P.C.; Peter F. Corless; Steven M. Jensen

(57) ABSTRACT

A packaging substrate includes a carrier and an interposer. The carrier has opposite top and bottom surfaces. A recess is formed on the top surface and a plurality of first conductive terminals are formed on the recess. Further, a plurality of second conductive terminals are formed on the bottom surface of the carrier. The interposer is disposed in the recess and has opposite first and second surfaces and a plurality of conductive through vias penetrating the first and second surfaces. A first conductive pad is formed on an end of each of the conductive through vias exposed from the first surface, and a second conductive pad is formed on the other end of each of the conductive through vias exposed from the second surface and electrically connected to a corresponding one of the first conductive terminals. Compared with the prior art, the invention improves the product reliability.

2 Claims, 7 Drawing Sheets

PACKAGING SUBSTRATE HAVING EMBEDDED INTERPOSER AND FABRICATION METHOD THEREOF

CROSS-REFERENCES TO RELATED APPLICATIONS

This application claims under 35 U.S.C. §119(a) the benefit of Taiwanese Application No. 100128085, filed Aug. 5, 2011, the entire contents of which is incorporated herein by reference.

BACKGROUND OF THE INVENTION

1. Field of the Invention

The present invention relates to packaging substrates and fabrication methods thereof, and more particularly, to a packaging substrate having an embedded interposer and a fabrication method thereof.

2. Description of Related Art

Along with the rapid development of electronic industries, electronic products tend to have reduced size, high performance, multi-function and high speed. FIG. 1 is a schematic cross-sectional view of a conventional flip-chip packaging structure.

Referring to FIG. 1, a bismaleimide-triazine (BT) packaging substrate 10 is provided. The packaging substrate 10 has a core layer 102 and opposite first and second surfaces 10a, 10b. A plurality of flip-chip bonding pads 100 are formed on the first surface 10a of the packaging substrate 10 and electrically connected to the electrode pads 120 of a semiconductor chip 12 through a plurality of solder bumps 11. An underfill 17 is filled between the first surface 10a of the packaging substrate 10 and the semiconductor chip 12 for encapsulating the solder bumps 11. Further, a plurality of solder ball bonding pads 101 are formed on the second surface 10b of the packaging substrate 10 such that solder balls 13 can be mounted on the solder ball bonding pads 101 for electrically connecting an external electronic device such as a printed circuit board (not shown).

Since the semiconductor chip 12 is fabricated below 45 nm node, a dielectric material having an extreme low k (ELK) or an ultra low k (ULK) is usually used in a back end of the line (BEOL) of the semiconductor chip 12. However, such a low-k dielectric material is porous and brittle. Therefore, during a thermal cycling test for reliability characterization of the flip chip package, the solder bumps 11 can easily crack due to uneven thermal stresses caused by a big difference between the thermal expansion coefficients (CIEs) of the packaging substrate 10 and the semiconductor chip 12, thereby easily causing the semiconductor chip 12 to crack and hence reducing the product reliability.

Further, in order to obtain electronic products having reduced size and improved functions, the semiconductor chip 12 tends to have a high density of nano-scale circuits so as to have reduced pitches between the electrode pads 120. On the other hand, the flip-chip bonding pads 100 of the packaging substrate 10 are only of micro-scale pitches. Hence, the packaging substrate 10 is not suitable for the high-density nano-scale circuits of the semiconductor chip 12, thereby adversely affecting the fabrication of electronic products having reduced size and improved functions.

Therefore, there is a need to provide a packaging substrate and a fabrication method thereof so as to overcome the above-described drawbacks.

SUMMARY OF THE INVENTION

Accordingly, the present invention provides a packaging substrate having an embedded interposer, which comprises: a carrier having opposite top and bottom surfaces, wherein a recess is formed on in the top surface of the carrier and a plurality of first conductive terminals are formed on the recess, and a plurality of second conductive terminals are formed on the bottom surface of the carrier for electrically connecting the carrier and an external electronic device; and an interposer disposed in the recess and having opposite first and second surfaces and a plurality of conductive through vias penetrating the first and second surfaces, wherein a first conductive pad is formed on an end of each of the conductive through vias exposed from the first surface so as for a semiconductor chip to be mounted thereon and electrically connected thereto, and a second conductive pad is formed on the other end of each of the conductive through vias exposed from the second surface and is electrically connected to a corresponding one of the first conductive terminals.

The present invention provides another packaging substrate having an embedded interposer, which comprises: a carrier having opposite top and bottom surfaces, wherein a recess is formed on the top surface of the carrier and a plurality of first conductive terminals are formed on the recess, and a plurality of second conductive terminals are formed on the bottom surface of the carrier for electrically connecting the carrier and an external electronic device; and an interposer disposed in the recess and having opposite first and second surfaces and a plurality of conductive through vias penetrating the first and second surfaces, wherein a first conductive pad is formed on an end of each of the conductive through vias exposed from the first surface, and a second conductive pad is formed on the other end of each of the conductive through via exposed from the second surface and electrically connected to a corresponding one of the first conductive terminals, further, a redistribution layer is formed on the first surface and the first conductive pads, and the outermost sub-layer of the redistribution layer has a plurality of extensive conductive pads so as for a semiconductor chip to be mounted thereon and electrically connected thereto.

The present invention further provides a fabrication method of a packaging substrate having an embedded interposer, which comprises the steps of: preparing a carrier having opposite top and bottom surfaces, wherein a recess is formed on the top surface of the carrier and a plurality of first conductive terminals are formed on the recess, and a plurality of second conductive terminals are formed on the bottom surface of the carrier for electrically connecting the carrier and an external electronic device; and disposing in the recess an interposer having opposite first and second surfaces and a plurality of conductive through vias penetrating the first and second surfaces, wherein a first conductive pad is formed on an end of each of the conductive through vias exposed from the first surface, and a second conductive pad is formed on the other end of each of the conductive through vias exposed from the second surface and electrically connected to a corresponding one of the first conductive terminals.

Therefore, by providing the interposer, the present invention provides a packaging substrate suitable for a semiconductor chip having high-density nano-scale circuits without changing original supply chains and infrastructures of IC industries. Further, since the CTEs of the interposer and the semiconductor chip are close to each other, the present invention prevents large thermal stresses from occurring between the semiconductor chip and the interposer, thereby effectively improving the product reliability. In addition, the present invention embeds the interposer in the packaging substrate so as to reduce the thickness of the overall structure. Furthermore, by embedding at least a metal post, a metal bump or a metal plate in the packaging substrate, the present invention facilitates dissipation of heat generated by the packaging substrate and the semiconductor chip, thus avoiding damages of the packaging substrate that would otherwise occur due to large thermal stresses during a thermal cycling test or during the use of the product.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms such as "one", "on", "top", "bottom" etc. are merely for illustrative purpose and should not be construed to limit the scope of the present invention.

Generally, the implementation of the present invention is divided into two stages: firstly, an interposer is prepared; and secondly, a packaging substrate having an embedded interposer is fabricated. FIGS. 2A to 2L are schematic cross-sectional views showing a fabrication method of an interposer according to the present invention.

Figure 2A:
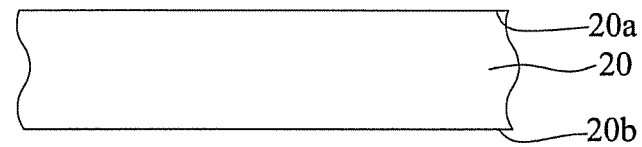
FIGS. 2A to 2L are schematic cross-sectional views showing a fabrication method of an interposer according to the present invention, wherein FIGS. 2K' and 2L' show other embodiments of FIGS. 2K and 2L, respectively.

Referring to FIG. 2A, a plate 20 having opposite first and second surfaces 20a, 20b is provided. The plate 20 can be made of silicon, poly-silicon or other semiconductor material.

Figure 2B:
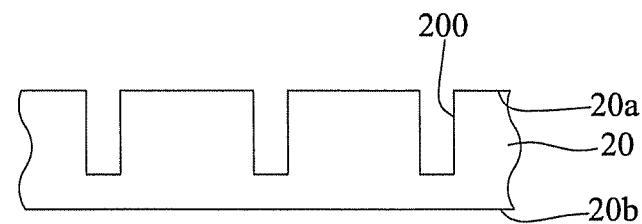

Referring to FIG. 2B, a plurality of trenchs 200 are formed in the first surface 20a of the plate 20. To form the trenchs 200, a coater, an aligner and a developer can be used to form on the first surface 20a a photoresist layer (not shown) having a plurality of openings for exposing portions of the plate 20. Then, the exposed portions of the plate 20 are etched by DRIE so as to form the trenchs 200. Finally, the photoresist layer is removed by such as a stripper.

Figure 2C:
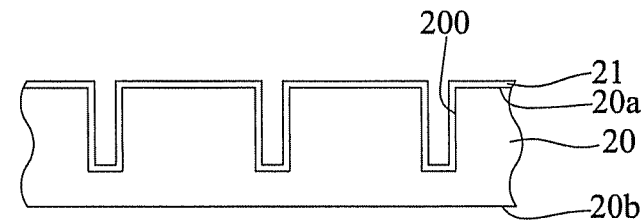

Referring to FIG. 2C, an insulating layer 21 made of such as silicon dioxide is formed on the first surface 20a and the surfaces of the trenchs 200 through plasma enhanced chemical vapor deposition (PECVD) or furnace process.

Figure 2D:
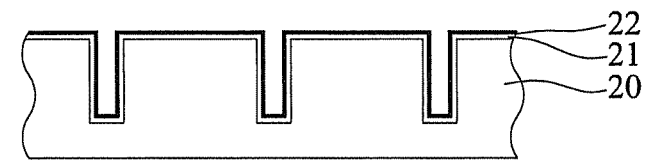

Referring to FIG. 2D, a conductive layer 22 is formed on the insulating layer 21 through such as sputtering.

Figure 2E:
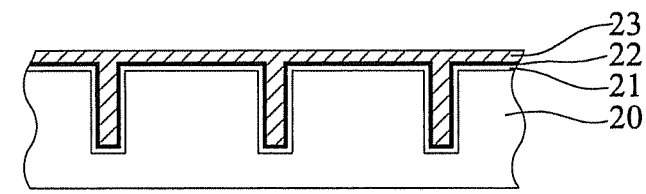

Referring to FIG. 2E, a metal layer 23 made of such as copper is formed on the conductive layer 22 through electroplating.

Figure 2F:
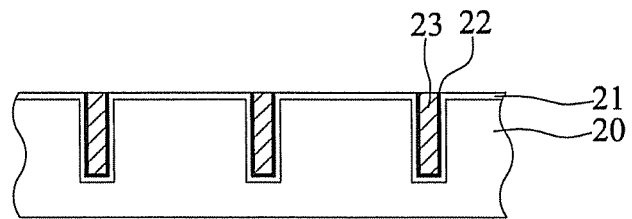

Referring to FIG. 2F, portions of the metal layer 23 and the conductive layer 22 higher than the top surface of the insulating layer 21 are removed by using such as a grinder, a polisher or through a chemical mechanical planarization (CMP) process.

Figure 2G:
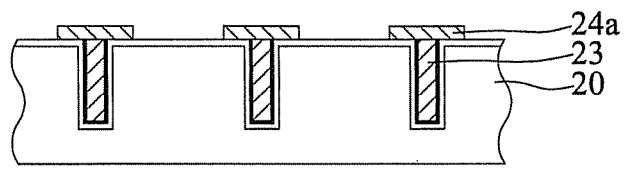

Referring to FIG. 2G, a plurality of first conductive pads 24a are formed on the remaining portions of the metal layer 23 so as for a semiconductor chip to be mounted thereon. According to the practical need, an under bump metallurgy (UBM) layer (not shown) can be formed on the first conductive pads 24a so as to improve the electrical connection reliability.

Figure 2H:
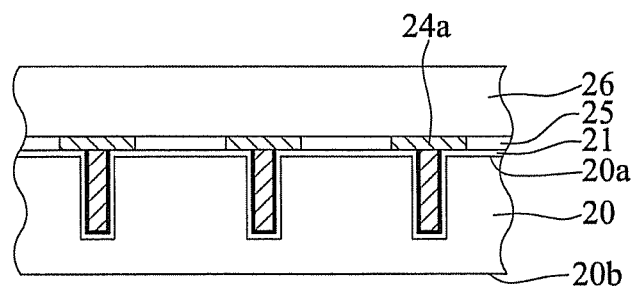

Referring to FIG. 2H, a first carrier 26 is attached to the insulating layer 21 and the first conductive pads 24a through an adhesive layer 25.

Figure 2I:
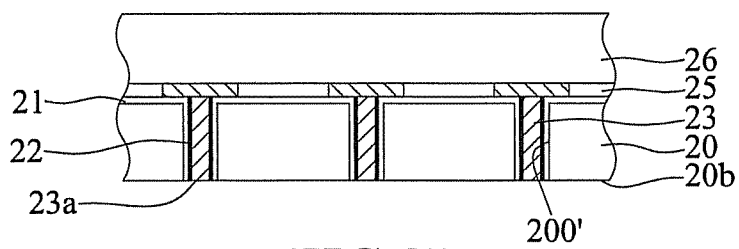

Referring to FIG. 2I, portions of the plate 20 and the insulating layer 21 are removed from the second surface 20b for exposing ends 23a of the metal layer 23, thereby forming a plurality of conductive through vias penetrating the first surface 20a and the second surface 20b of the plate 20. Each of the conductive through vias has a through hole 200' penetrating the first surface 20a and the second surface 20b, an insulating layer 21 formed on the sidewall of the through hole 200' and a metal layer 23 filling the through hole 200'.

Figure 2J:
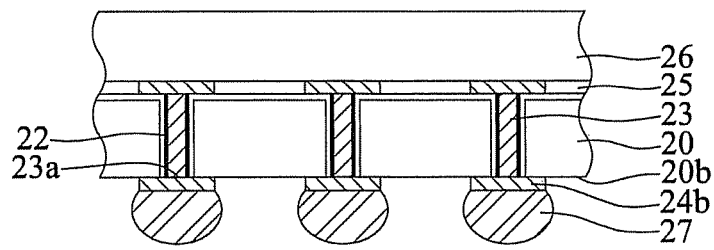

Referring to FIG. 2J, a plurality of second conductive pads 24b are formed on the exposed ends 23a of the metal layer 23, and a plurality of solder bumps 27 are further formed on the second conductive pads 24b. According to the practical need, a UBM layer (not shown) can be first formed on the second conductive pads 24b and then the solder bumps 27 are formed on the UMB layer, thereby improving the electrical connection reliability.

Figure 2K:
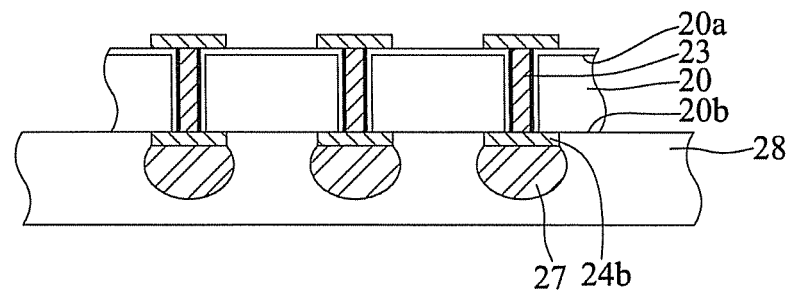
Figure 2K:
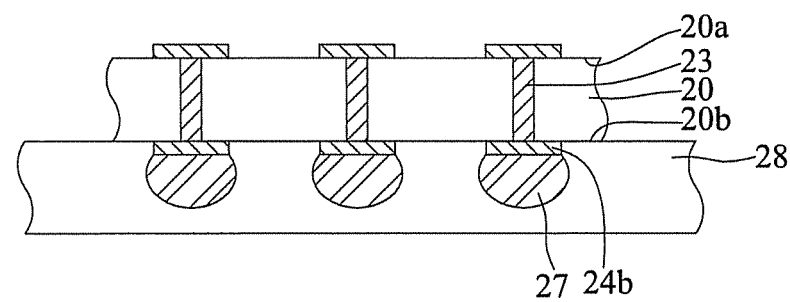

Referring to FIG. 2K, a second carrier 28 is disposed on the second surface 20b for covering the solder bumps 27, and the first carrier 26 and the adhesive layer 25 are removed.

In another embodiment, referring to FIG. 2K', the interposer does not have the insulating layer 21 and the conductive layer 22. That is, the metal layer 23 is directly formed to penetrate the plate 20. Therein, the plate 20 can be made of glass, ceramic such as $Al_2O_3$ or MN. Preferably, the plate 20 is made of ceramic, since the coefficient of thermal expansion (CTE) of ceramic (approximately 3 ppm/) is close to that of silicon.

Figure 2L:
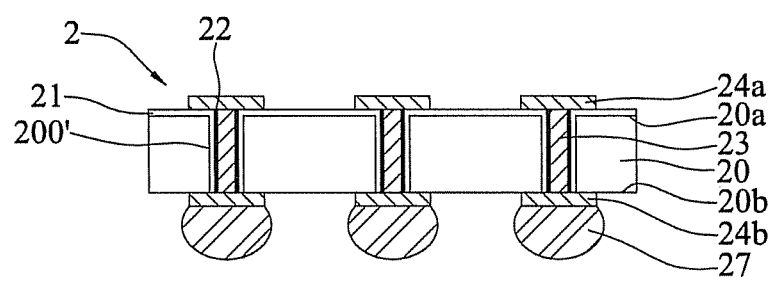
Figure 2L:
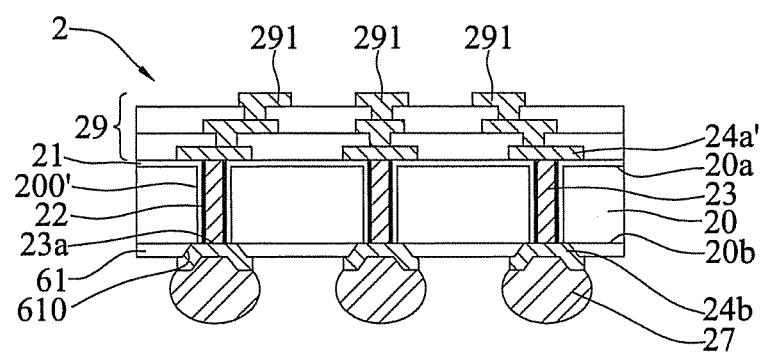

Referring to FIG. 2L, a cutting process is performed and the second carrier 28 is removed so as to obtain a plurality of interposers 2.

In another embodiment, referring to FIG. 2L', a plurality of first conductive pads 24a' are formed on the metal layer 23 and further a redistribution layer (RDL) 29 is formed on the first surface 20a and the first conductive pads 24a'. The outermost sub-layer of the redistribution layer 29 has a plurality of extensive conductive pads 291 so as for a semiconductor chip to be mounted thereon and electrically connected thereto. Moreover, a dielectric layer 61 can be formed on the second surface 20b. The dielectric layer 61 has a plurality of openings 610 for exposing the metal layer 23, and a plurality of second conductive pads 24b are formed in the openings 610, respectively.

FIGS. 3A to 3G are schematic cross-sectional views showing a packaging substrate having an embedded interposer and a fabrication method thereof.

Figure 3A:
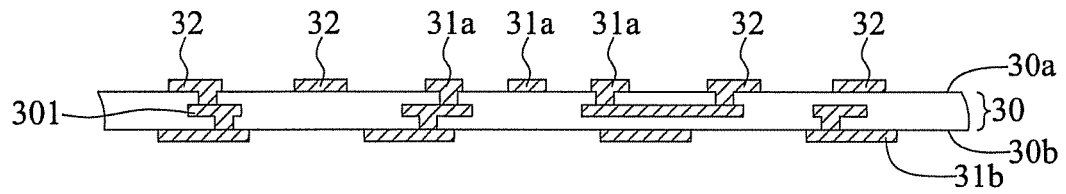
FIGS. 3A to 3G are schematic cross-sectional views showing a fabrication method of a packaging substrate having an embedded interposer according to the present invention, wherein FIG. 3F' shows another embodiment of FIG. 3F, and FIGS. 3G-1', 3G-2, 3G-3, 3G-4 and 3G-5 show other embodiments of FIG. 3G-1.

Referring to FIG. 3A, a multi-layer interconnect base plate 30 is provided. The multi-layer interconnect base plate 30 has opposite third and fourth surfaces 30a, 30b and at least a circuit layer 301. The third surface 30a has a plurality of first conductive terminals 31a and a plurality of third conductive pads 32, and the fourth surface 30b has a plurality of second conductive terminals 31b. The circuit layer 301, the first conductive terminals 31a, the third conductive pads 32 and the second conductive terminals 31b can be made of copper. According to the practical need, a UBM layer (not shown) can be formed on the first conductive terminals 31a and the second conductive terminals 31b for improving the electrical connection reliability.

Figure 3B:
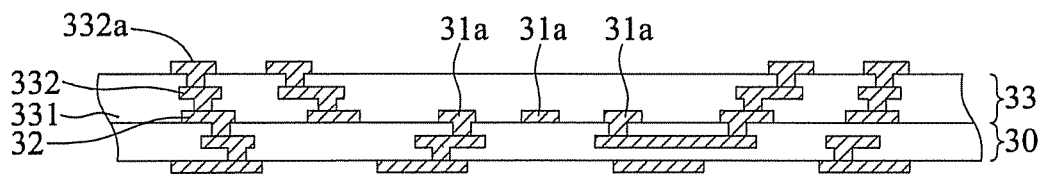

Referring to FIG. 3B, a built-up structure 33 is formed on the third surface 30a. The built-up structure 33 has a dielectric layer 331, a circuit layer 332 formed on the dielectric layer 331 and a plurality of conductive pads 332a exposed from the dielectric layer 331 and electrically connected to the circuit layer 332 and the third conductive pads 32. The dielectric layer 331 can be made of ABF (Ajinomoto Build-up Film) or BT (Bismaleimide-Triazine). The circuit layer 332 and the conductive pads 332a can be made of copper.

Figure 3C:
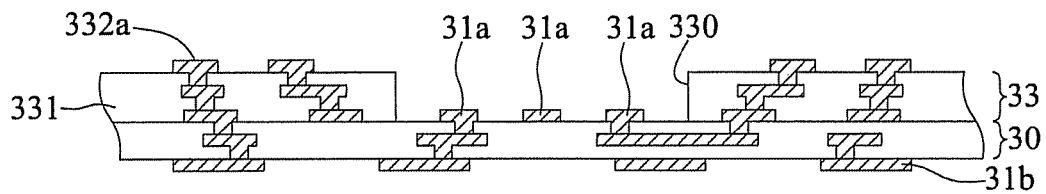

Referring to FIG. 3C, portions of the dielectric layer 331 are removed through such as laser so as to form a cavity 330 exposing the first conductive terminals 31a.

Figure 3D:
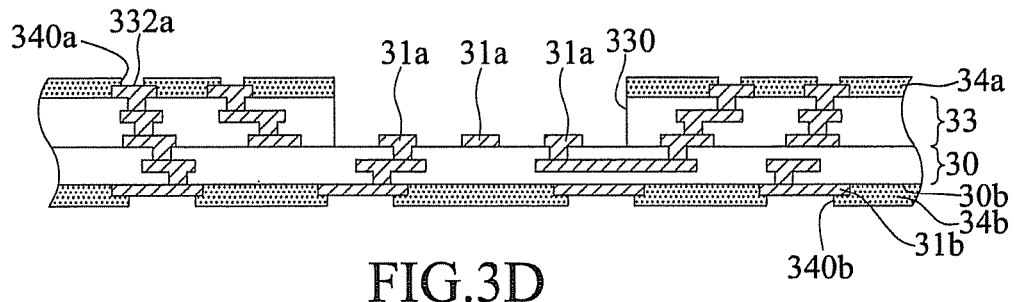

Referring to FIG. 3D, a first insulating protection layer 34a is formed on the built-up structure 33. The first insulating protection layer 34a has a plurality of first openings 340a for exposing the conductive pads 332a, respectively. A second insulating protection layer 34b is formed on the fourth surface 30b and has a plurality of second openings 340b for exposing the second conductive terminals 31b, respectively.

In another embodiment, the structure of FIG. 3D can be simplified as or viewed as a carrier, which has a top surface (such as the top of the built-up structure 33) and a bottom surface (the fourth surface 30b of the multi-layer interconnect base plate 30) and a recess formed on the top surface. The bottom surface of the carrier has a plurality of conductive terminals for electrically connecting an external electronic device, and the bottom of the recess has a plurality of conductive terminals for electrically connecting the interposer 2.

Figure 3E:
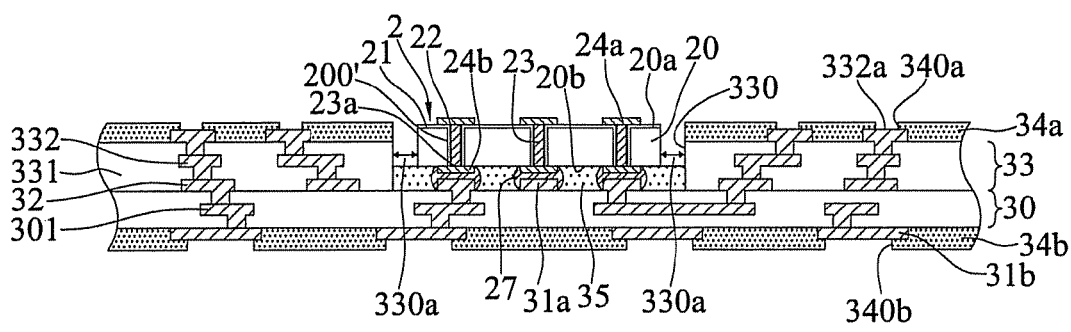

Referring to FIG. 3E, the interposer 2 of FIG. 2L is disposed in the cavity 330 with the second conductive pads 24b electrically connected to the first conductive terminals 31a, respectively. A stress relief gap 330a is formed between the interposer 2 and the sidewall of the cavity 330. An underfill 35 is filled between the interposer 2 and the bottom of the cavity 330 so as to obtain a packaging substrate having an embedded interposer.

Figure 3F:
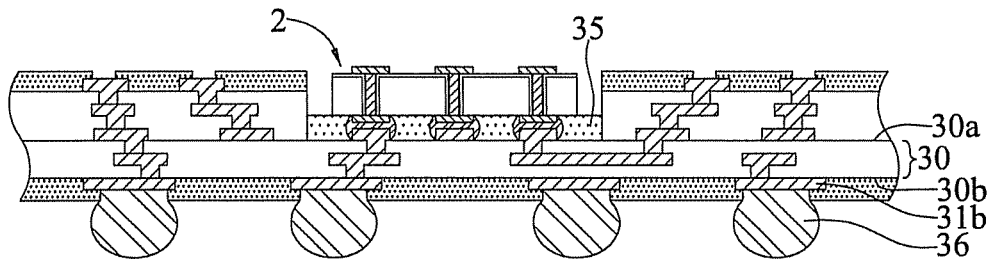
Figure 3F:
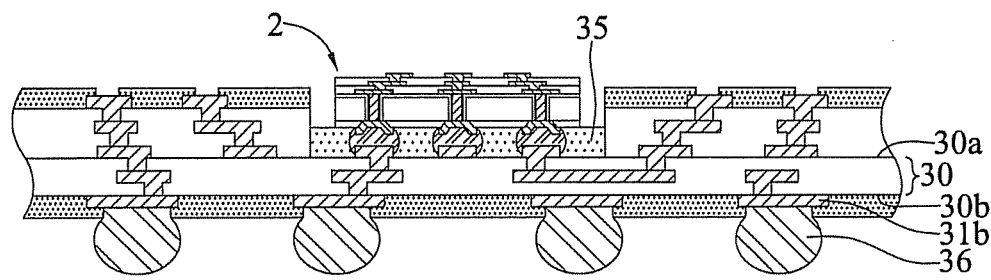

Referring to FIG. 3F, a plurality of solder balls 36 can further be mounted on the second conductive terminals 31b. Alternatively, the interposer 2 of FIG. 3F is replaced with the interposer 2 of FIG. 2L' so as to obtain a structure of FIG. 3F'.

Figure 1:
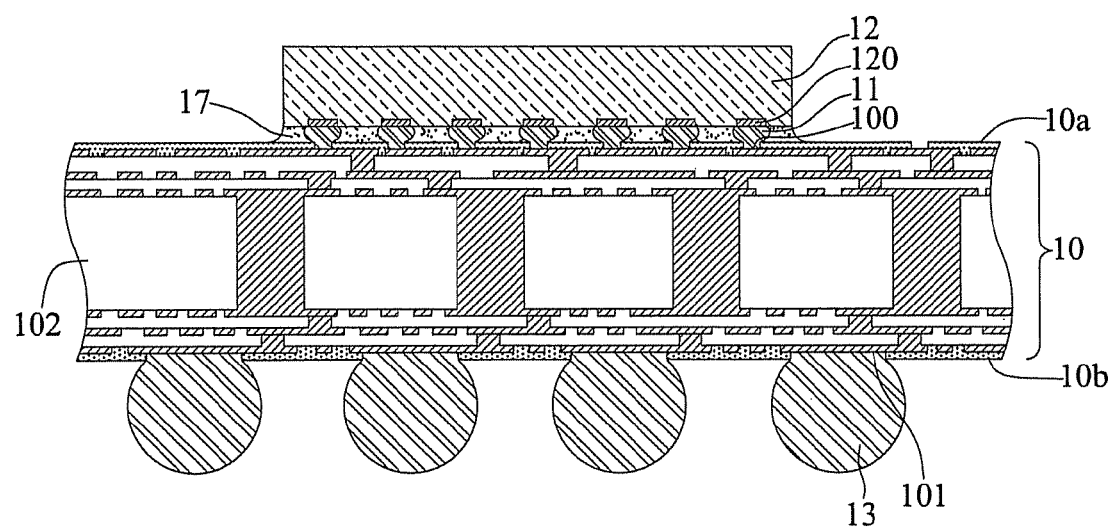
FIG. 1 is a schematic cross-sectional view showing a conventional flip-chip packaging structure.
Figures 1, 3G:
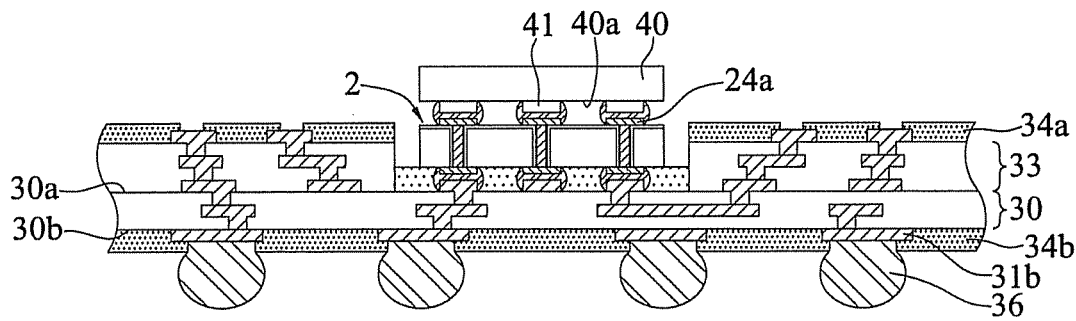
Figures 1, 3G:
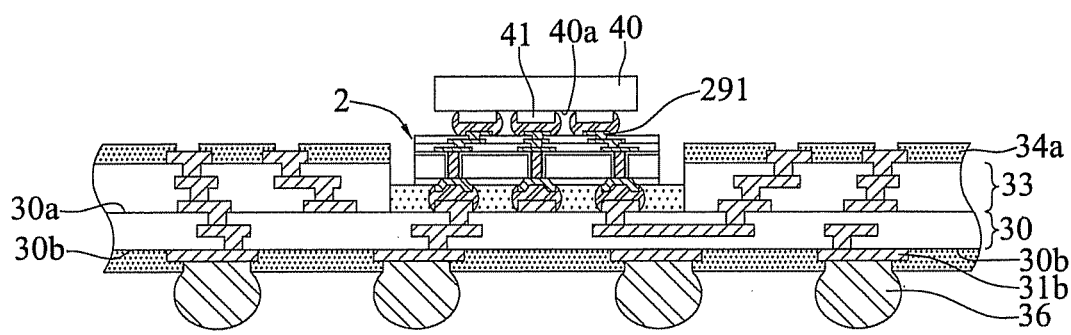

Referring to FIGS. 3G-1 and 3G-1' that are continued from FIGS. 3F and 3F', respectively, a semiconductor chip 40 having an active surface 40a with a plurality of electrode pads 41 is disposed on the interposer 2. The electrode pads 41 of the active surface 40a are electrically connected to the first conductive pads 24a (FIG. 3G-1), respectively, or electrically connected to the extensive conductive pads 291 (FIG. 3G-1').

Figures 2, 3G:
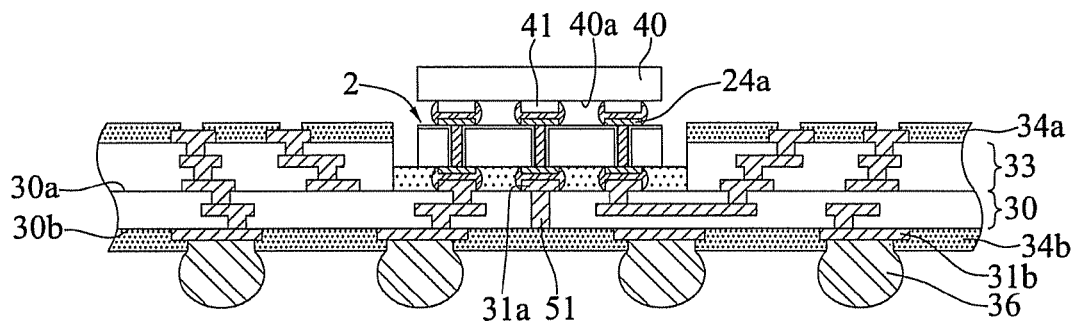

Referring to FIG. 3G-2, the multi-layer interconnect base plate 30 of FIG. 3G-1 further has at least a metal pillar 51 penetrating the third and fourth surfaces 30a, 30b and electrically connecting at least one of the first conductive terminals 31a.

Figures 3, 3G:
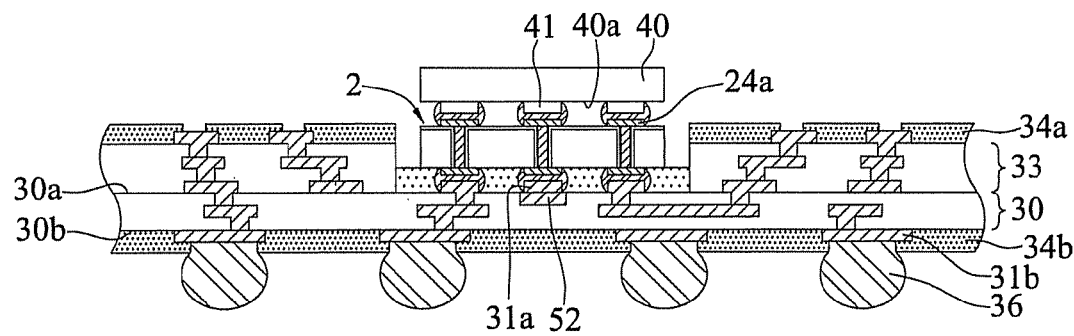

Referring to FIG. 3G-3, the multi-layer interconnect base plate 30 of FIG. 3G-1 further has at least a metal bump 52 disposed therein and electrically connecting at least one of the first conductive terminals 31a.

Figures 3, 3G, 4:
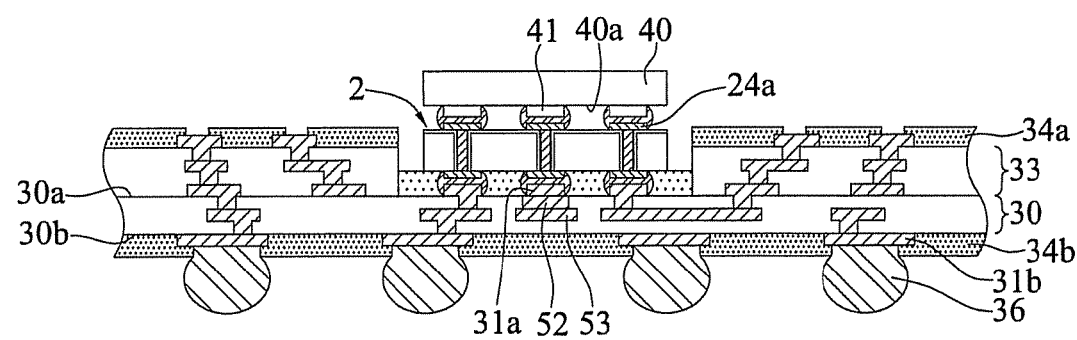
Figures 3, 3G, 4, 5:
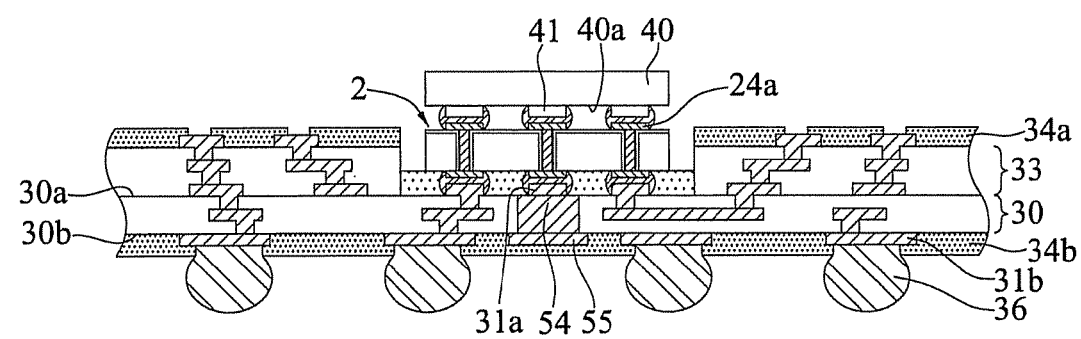

Referring to FIG. 3G-4, the multi-layer interconnect base plate 30 of FIG. 3G-3 further has a metal plate 53 disposed therein and electrically connecting the bottom of the at least a metal bump 52.

Referring to FIG. 3G-5, the multi-layer interconnect base plate 30 of FIG. 3G-1 further has at least a metal bump 54 penetrating the third and fourth surfaces 30a, 30b and connecting one of the first conductive terminals 31a, and a metal plate 55 disposed on the fourth surface 30b and electrically connecting at least a the metal bump 54.

It should be noted that the metal pillar 51, the metal bump 52, the metal plate 53, the metal bump 54 and the metal plate 55 are used to improve the heat dissipating effect so as to protect the packaging substrate from being damaged by overheating.

The present invention further provides a packaging substrate having an embedded interposer, as shown in FIG. 3F. The packaging substrate has a carrier and an interposer 2. The carrier has opposite top and bottom surfaces. A recess is formed on the top surface of the carrier. A plurality of first conductive terminals 31a are formed on the bottom of the recess, and a plurality of second conductive terminals 31b are formed on the bottom surface of the carrier for electrically connecting the carrier and an external electronic device. The interposer 2 is disposed in the recess and has opposite first and second surfaces 20a, 20b, and a plurality of conductive through vias penetrating the first and second surfaces, 20a, 20b. A first conductive pad 24a is disposed on an end of each of the conductive through vias exposed from the first surface 20a so as for a semiconductor chip to be mounted and electrically connected thereto, and a second conductive pad 24b is disposed on the other end of each of the conductive through vias exposed from the second surface 20b and is electrically connected to a corresponding one of the first conductive terminals 31a.

The present invention provides another packaging substrate having an interposer. Referring to FIG. 3F', the packaging substrate has a carrier and an interposer 2. The carrier has opposite top and bottom surfaces. A recess is formed on the top surface of the carrier and a plurality of first conductive terminals 31a are formed on the bottom of the recess, and a plurality of second conductive terminals 31b are formed on the bottom surface of the carrier for electrically connecting the carrier and an external electronic device. The interposer 2 is disposed in the recess and has opposite first and second surfaces 20a, 20b and a plurality of conductive through vias penetrating the first and second surfaces 20a, 20b. A first conductive pad 24a' is formed on an end of each of the conductive through vias exposed from the first surface 20a, and a second conductive pad 24b is formed on the other end of each of the conductive through vias exposed from the second surface 20b and electrically connected to a corresponding one of the first conductive terminals 31a. Further, a redistribution layer 29 is formed on the first surface 20a and the first conductive pads 24a', and the outermost sub-layer of the redistribution layer 29 has a plurality of extensive conductive pads 291 so as for a semiconductor chip to be mounted thereon and electrically connected thereto.

In the above-describe packaging substrates, each of the conductive through vias can have a through hole 200' penetrating the first surface 20a and the second surface 20b, an insulating layer 21 formed on the sidewall of the through hole 200', and a metal layer 23 filling the through hole 200'.

In the above-described packaging substrates, the carrier can have a multi-layer interconnect base plate 20 and a built-up structure 33. The multi-layer interconnect base plate 20 has a third surface 20a and a fourth surface 30b opposite to the third surface 30a. The built-up structure 33 is formed on the third surface 30a and has a cavity 330 for exposing a portion of the multi-layer interconnect base plate 30.

The packaging substrates can further have an underfill 35 formed between the interposer 2 and the bottom of the recess.

In the above-described packaging substrates, the multi-layer interconnect base plate 30 can further have at least a metal pillar 51 penetrating the third and fourth surfaces 30a, 30b and electrically connecting at least one of the first conductive terminals 31a.

The multi-layer interconnect base plate 30 can further have at least a metal bump 52 disposed therein and electrically connecting at least one of the first conductive terminals 31a. The multi-layer interconnect base plate 30 can further have a metal plate 53 disposed therein and electrically connecting the at least a metal bump 52.

The multi-layer interconnect base plate 30 can further have at least a metal bump 54 penetrating the third and fourth surfaces 30a, 30b and electrically connecting at least one of the first conductive terminals 31a. The multi-layer interconnect base plate 30 can further have a metal plate 55 disposed therein and electrically connecting the at least a metal bump 54.

A stress relief gap 330a can be formed between the interposer 2 and the sidewall of the recess.

It should be noted that the external electronic device can be a circuit board or other packaging structure. Although a coreless carrier is exemplified herein, it is not intended to limit the present invention. A carrier having a core can also be applied in the present invention. In addition, although solder balls are used herein for electrically connecting the interposer and the carrier, the interposer and the semiconductor chip, and the carrier and the external electronic device, the present invention is not limited to the solder balls. Other electrical connection methods can be alternatively used.

Therefore, by providing the interposer, the present invention provides a packaging substrate suitable for a semiconductor chip having high-density nano-scale circuits without changing original supply chains and infrastructures of IC industries. Further, since the CTEs of the interposer and the semiconductor chip are close to each other, the present invention prevents large thermal stresses from occurring between the semiconductor chip and the interposer, thereby effectively improving the product reliability. In addition, the present invention embeds the interposer in the packaging substrate so as to reduce the thickness of the overall structure. Furthermore, by embedding a metal post, a metal bump or a metal plate in the packaging substrate, the present invention facilitates dissipation of heat generated by the packaging substrate and the semiconductor chip, thus avoiding damages of the packaging substrate that would otherwise occur due to large thermal stresses during a thermal cycling test or during the use of the product.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A fabrication method of a packaging substrate having an embedded interposer, comprising the steps of:

preparing a multi-layer interconnect base plate having opposite third and fourth surfaces, wherein the third surface has a plurality of first conductive terminals disposed thereon;

forming a built-up structure on the third surface of the multi-layer interconnect base plate;

removing a portion of the built-up structure through a laser so as to form a cavity and expose the plurality of first conductive terminals from the cavity, thereby providing a carrier having opposite top and bottom surfaces, wherein the carrier comprises the multi-layer interconnect base plate and the built-up structure having a recess, the recess is formed on the top surface of the carrier and the plurality of first conductive terminals are formed on the recess, and a plurality of second conductive terminals are formed on the bottom surface of the carrier for electrically connecting the carrier and an external electronic device; and disposing in the recess an interposer having opposite first and second surfaces and a plurality of conductive through vias penetrating the first and second surfaces, wherein a first conductive pad is formed on an end of each of the conductive through vias exposed from the first surface, and a second conductive pad is formed on the other end of each of the conductive through vias exposed from the second surface and electrically connected to a corresponding one of the first conductive terminals.

2. The method of claim 1, further comprising forming a redistribution layer on the first surface of the interposer and the first conductive pads, wherein the outermost sub-layer of the redistribution layer has a plurality of extensive conductive pads so as for a semiconductor chip to be mounted thereon and electrically connected thereto.

* * * * *